(12) United States Patent
Chen et al.

(10) Patent No.: US 10,852,271 B2
(45) Date of Patent: Dec. 1, 2020

(54) ON-CHIP HEATER

(71) Applicant: Taiwan Semiconductor Manufacturing Co., Ltd., Hsinchu (TW)

(72) Inventors: Tung-Tsun Chen, Hsinchu (TW); Jui-Cheng Huang, Hsinchu (TW); Kun-Lung Chen, Chu-pei (TW); Cheng-Hsiang Hsieh, Taipei (TW)

(73) Assignee: Taiwan Semiconductor Manufacturing Co., Ltd.

( * ) Notice: Subject to any disclaimer, the term of this patent is extended or adjusted under 35 U.S.C. 154(b) by 547 days.

(21) Appl. No.: 15/378,794

(22) Filed: Dec. 14, 2016

(65) Prior Publication Data

US 2018/0164246 A1 Jun. 14, 2018

(51) Int. Cl.
*G01N 27/414* (2006.01)
*H01L 27/12* (2006.01)

(52) U.S. Cl.
CPC ..... *G01N 27/4145* (2013.01); *H01L 27/1203* (2013.01); *H05B 2203/013* (2013.01)

(58) Field of Classification Search
CPC ............ G01N 27/4145; G01N 27/4148; H01L 27/1203; H05B 2203/013
See application file for complete search history.

(56) References Cited

U.S. PATENT DOCUMENTS

| | | | | |
|---|---|---|---|---|
| 3,813,520 A | * | 5/1974 | Brouneus | H05B 3/265 219/543 |
| 5,294,778 A | * | 3/1994 | Carman | H01L 21/67103 118/725 |
| 5,396,047 A | * | 3/1995 | Schilling | F24C 15/106 219/448.11 |
| 6,111,280 A | * | 8/2000 | Gardner | G01N 27/128 257/253 |
| 6,242,722 B1 | * | 6/2001 | Provancha | H05B 3/748 118/725 |
| 7,849,727 B2 | * | 12/2010 | Gardner | G01N 33/0031 73/31.06 |
| 8,536,496 B2 | * | 9/2013 | Ptasienski | H05B 3/46 219/543 |
| 9,689,835 B2 | | 6/2017 | Liu et al. | |
| 9,746,437 B1 | * | 8/2017 | Chiou | B81C 1/00246 |

(Continued)

FOREIGN PATENT DOCUMENTS

EP 2 975 386 A 1/2016
KR 10-2016-0130814 11/2016

OTHER PUBLICATIONS

German Office Action directed toward related German patent application No. DE 102016125295.6, dated Aug. 25, 2017, mailed from the German Patent Office; 12 pages.

*Primary Examiner* — Kenneth Parker
*Assistant Examiner* — Scott E Bauman
(74) *Attorney, Agent, or Firm* — Sterne, Kessler, Goldstein & Fox P.L.L.C.

(57) ABSTRACT

An on-chip heater in a concentric rings configuration having non-uniform spacing between heating elements provides improved radial temperature uniformity and low power consumption compared to circular or square heating elements. On-chip heaters are suitable for integration and use with on-chip sensors that require tight temperature control.

20 Claims, 9 Drawing Sheets

(56) References Cited

U.S. PATENT DOCUMENTS

| | | | |
|---|---|---|---|
| 2004/0149718 A1* | 8/2004 | Ito | H01L 21/67109 |
| | | | 219/444.1 |
| 2009/0126460 A1* | 5/2009 | Gardner | G01N 33/0031 |
| | | | 73/31.06 |
| 2012/0217550 A1* | 8/2012 | Usagawa | G01N 27/4141 |
| | | | 257/253 |
| 2014/0175570 A1* | 6/2014 | Lee | G01N 27/128 |
| | | | 257/414 |
| 2014/0225166 A1 | 8/2014 | Ellis-Monaghan et al. | |
| 2015/0129937 A1* | 5/2015 | Chen | G01N 27/4145 |
| | | | 257/253 |
| 2016/0011134 A1* | 1/2016 | Kuemin | G01N 27/123 |
| | | | 219/448.11 |
| 2016/0334362 A1* | 11/2016 | Liu | G01N 27/4145 |
| 2017/0074815 A1* | 3/2017 | Udrea | G01N 27/14 |
| 2017/0343498 A1* | 11/2017 | Kalnitsky | H01L 29/78696 |
| 2018/0038816 A1* | 2/2018 | Hsiao | G01N 27/125 |

\* cited by examiner

ON-CHIP HEATER

BACKGROUND

Several types of sensors, such as bio-sensors, gas sensors, ion sensors and the like, are often times integrated on a chip with complementary metal oxide semiconductor (CMOS) circuits for improved sensitivity, cost reduction and portability. In some instances these sensors integrated on-chip heaters.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1A:
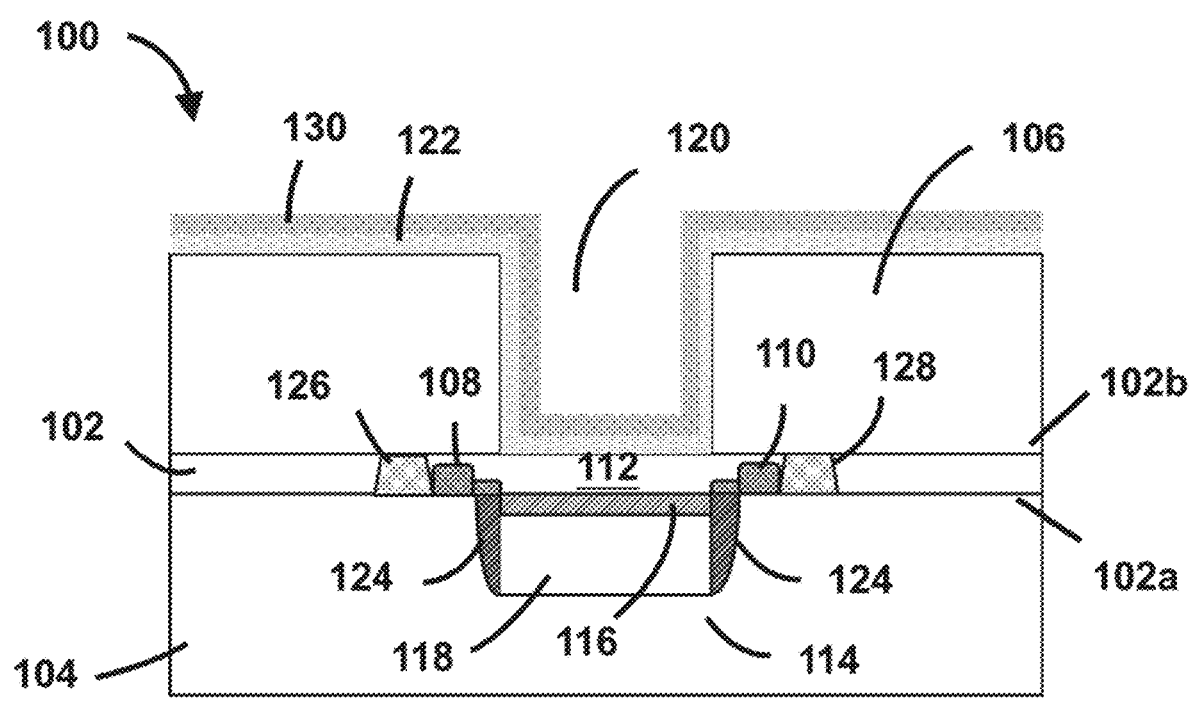
FIG. 1A is cross-sectional view of an exemplary sensor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

Unless defined otherwise, all technical and scientific terms used herein have the same meanings as commonly understood by one of ordinary skill in the art to which this disclosure belongs. Although any methods and materials similar or equivalent to those described herein can be used in the practice or testing of embodiments in accordance with the disclosure; the methods, devices, and materials are now described. All patents and publications mentioned herein are incorporated herein by reference for the purpose of describing and disclosing the materials and methodologies which are reported in the publications which might be used in connection with the embodiments in accordance with this disclosure.

The acronym "FET," as used herein, refers to a field effect transistor. A very common type of FET is referred to as a metal oxide semiconductor field effect transistor (MOSFET). Historically, MOSFETs have been planar structures built in and on the planar surface of a substrate such as a semiconductor wafer. But advances in semiconductor manufacturing have resulted in three-dimensional MOSFET structures, such as, for example, fin-based MOSFETs.

"S/D" refers to the source/drain junctions that form two of the three terminals of a FET.

The terms "front-side" and "back-side" are commonly used in the semiconductor manufacturing industry to refer, respectively, to a first side of a wafer on which the transistor circuitry and various layers of interconnect are disposed, and to a second side of the wafer that is opposed to the first side. Wafers are sometimes referred to as substrates.

The term "bioFET" refers to a FET that includes a layer of immobilized probe molecules that act as surface receptors to detect the presence of a target analyte of biological origin. A bioFET is a field-effect sensor with a semiconductor transducer, according to an embodiment. One advantage of bioFETs is the prospect of label-free operation. Specifically, bioFETs enable the avoidance of costly and time-consuming labeling operations such as the labeling of an analyte with, for instance, fluorescent or radioactive probes. One specific type of bioFET described herein is a dual-gate back-side sensing bioFET. The analytes for detection by a BioFET will normally be of biological origin, such as—without limitation—proteins, carbohydrates, lipids, tissue fragments or portions thereof. However, in a more general sense a BioFET is part of a broader genus of FET sensors that may also detect any chemical compound (known in the art as a ChemFET), or any other element, including ions, such as protons or metallic ions (known in the art as an ISFET). This invention is meant to apply to all types of FET-based sensors ("FET Sensor"). One specific type of FET Sensor herein is a Dual-Gate Back Side Sensing FET Sensor ("DG BSS FET Sensor").

The term "dual-gate back-side sensing FET (DG-BSS FET)" refers to a FET structure having a primary gate stack and a secondary gate stack disposed on vertically opposing surfaces of a common channel region, and a first source/drain and a second source/drain laterally separated from each other by the common channel region. The primary gate stack has a first gate dielectric disposed on a first surface of the common channel region, and a first gate electrode disposed on the first gate dielectric. The secondary gate stack has a second gate dielectric disposed on the second surface of the common channel region that opposes the first surface of the common channel region, and a capture reagent disposed on the second gate dielectric. In this configuration the FET structure becomes, in powered operation, a sensor that detects the presence of a target analyte through its secondary gate stack. Unless note otherwise herein, the primary gate stack is on the front-side and the second gate dielectric is on the back-side.

The expression "high-k" refers to a high dielectric constant. As used herein, high-k refers to a dielectric constant that is greater than the dielectric constant of $SiO_2$ (i.e., greater than 3.9). Similarly the expression "low-k" refers to a low dielectric constant. As used herein, low-k refers to a dielectric constant that is less than the dielectric constant of $SiO_2$ (i.e., less than 3.9).

The term "analysis" generally refers to a process or step involving physical, chemical, biochemical, or biological analysis that includes, but is not limited to, characterization, testing, measurement, optimization, separation, synthesis, addition, filtration, dissolution, or mixing.

The term "assay" generally refers to a process or step involving the analysis of a chemical or a target analyte and includes, but is not limited to, cell-based assays, biochemical assays, high-throughput assays and screening, diagnostic assays, pH determination, nucleic acid hybridization assays, polymerase activity assays, nucleic acid and protein sequencing, immunoassays (e.g., antibody-antigen binding assays, ELISAs, and iqPCR), bisulfite methylation assays for detecting methylation pattern of genes, protein assays, protein binding assays (e.g., protein-protein, protein-nucleic acid, and protein-ligand binding assays), enzymatic assays, coupled enzymatic assays, kinetic measurements (e.g., kinetics of protein folding and enzymatic reaction kinetics), enzyme inhibitor and activator screening, chemiluminescence and electrochemiluminescence assays, fluorescent assays, fluorescence polarization and anisotropy assays, absorbance and colorimetric assays (e.g., Bradford assay, Lowry assay, Hartree-Lowry assay, Biuret assay, and BCA assay), chemical assays (e.g., for the detection of environmental pollutants and contaminants, nanoparticles, or polymers), and drug discovery assays. The apparatus, systems, and methods described herein may use or adopt one or more of these assays to be used with any DG-BSS FET.

The term "liquid biopsy" generally refers to a biopsy sample obtained from a subject's bodily fluid as compared to a subject's tissue sample. The ability to perform assays using a body fluid sample is oftentimes more desirable than using a tissue sample. The less invasive approach using a body fluid sample has wide ranging implications in terms of patient welfare, the ability to conduct longitudinal disease monitoring, and the ability to obtain expression profiles even when tissue cells are not easily accessible, e.g., in the prostate gland. Assays used to detect target analytes in liquid biopsy samples include, but are not limited to, those described above. As a non-limiting example, a circulating tumor cell (CTC) assay can be conducted on a liquid biopsy sample.

For example, a capture reagent (e.g., an antibody) immobilized on a FET sensor (e.g., the second dielectric layer of a DG-BSS FET) may be used for biorecognition reaction with a target analyte (e.g., a tumor cell marker) in a liquid biopsy sample using a CTC assay. CTCs are cells that have shed into the vasculature from a tumor and circulate, e.g., in the bloodstream. Generally CTCs are present in circulation in extremely low concentrations. To assay the CTCs, CTCs are enriched from patient blood or plasma by various techniques known in the art. CTCs may be stained for specific markers using methods known in the art including, but not limited to, cytometry (e.g., flow cytometry)-based methods and IHC-based methods. For the apparatus, systems, and methods described herein, CTCs may be captured using a capture reagent, or the nucleic acids, proteins, or other cellular milieu from the CTCs may be targeted as target analytes for binding to a capture reagent.

When a target analyte is detected on or from a CTC, e.g., an increase in target analyte expressing or containing CTCs may help identify the subject as having a cancer that is likely to respond to a specific therapy (e.g., one associated with a target analyte) or allow for optimization of a therapeutic regimen with, e.g., an antibody to the target analyte. CTC measurement and quantitation can provide information on, e.g., the stage of tumor, response to therapy, disease progression, or a combination thereof. The information obtained from detecting the target analyte on the CTC can be used, e.g., as a prognostic, predictive, or pharmacodynamic biomarker. In addition, CTCs assays for a liquid biopsy sample may be used either alone or in combination with additional tumor marker analysis of solid biopsy samples.

The term "identification" generally refers to the process of determining the identity of a target analyte based on its binding to a capture reagent whose identity is known.

The term "measurement" generally refers to the process of determining the amount, quantity, quality, or property of a target analyte based on its binding to a capture reagent.

The term "quantitation" generally refers to the process of determining the quantity or concentration of a target analyte based on its binding to a capture reagent.

The term "detection" generally refers to the process of determining the presence or absence of a target analyte based on its binding to a capture reagent. Detection includes but is not limited to identification, measurement, and quantitation.

The term "chemical" refers to a substance, compound, mixture, solution, emulsion, dispersion, molecule, ion, dimer, macromolecule such as a polymer or protein, biomolecule, precipitate, crystal, chemical moiety or group, particle, nanoparticle, reagent, reaction product, solvent, or fluid any one of which may exist in the solid, liquid, or gaseous state, and which is typically the subject of an analysis.

The term "reaction" refers to a physical, chemical, biochemical, or biological transformation that involves at least one chemical and that generally involves (in the case of chemical, biochemical, and biological transformations) the breaking or formation of one or more bonds such as covalent, noncovalent, van der Waals, hydrogen, or ionic bonds. The term includes typical chemical reactions such as synthesis reactions, neutralization reactions, decomposition reactions, displacement reactions, reduction-oxidation reactions, precipitation, crystallization, combustion reactions, and polymerization reactions, as well as covalent and non-covalent binding, phase change, color change, phase formation, crystallization, dissolution, light emission, changes of light absorption or emissive properties, temperature change or heat absorption or emission, conformational change, and folding or unfolding of a macromolecule such as a protein.

"Capture reagent" as used herein, is a molecule or compound capable of binding the target analyte or target reagent, which can be directly or indirectly attached to a substantially solid material. The capture reagent can be a chemical, and specifically any substance for which there exists a naturally occurring target analyte (e.g., an antibody, polypeptide, DNA, RNA, cell, virus, etc.) or for which a target analyte can be prepared, and the capture reagent can bind to one or more target analytes in an assay.

"Target analyte" as used herein, is the substance to be detected in the test sample using embodiments in accordance with this disclosure. The target analyte can be a chemical, and specifically any substance for which there exists a naturally occurring capture reagent (e.g., an antibody, polypeptide, DNA, RNA, cell, virus, etc.) or for which a capture reagent can be prepared, and the target analyte can bind to one or more capture reagents in an assay. "Target analyte" also includes any antigenic substances, antibodies, and combinations thereof. The target analyte can include a protein, a peptide, an amino acid, a carbohydrate, a hormone, a steroid, a vitamin, a drug including those administered for therapeutic purposes as well as those administered for illicit purposes, a bacterium, a virus, and metabolites of or antibodies to any of the above substances.

"Test sample" as used herein, means the composition, solution, substance, gas, or liquid containing the target analyte to be detected and assayed. The test sample can contain other components besides the target analyte, can have the physical attributes of a liquid, or a gas, and can be of any size or volume, including for example, a moving stream of liquid or gas. The test sample can contain any substances other than the target analyte as long as the other substances do not interfere with the binding of the target analyte with the capture reagent or the specific binding of the first binding member to the second binding member. Examples of test samples include, but are not limited to, naturally-occurring and non-naturally occurring samples or combinations thereof. Naturally-occurring test samples can be synthetic or synthesized. Naturally-occurring test samples include body or bodily fluids isolated from anywhere in or on the body of a subject, including but not limited to, blood, plasma, serum, urine, saliva or sputum, spinal fluid, cerebrospinal fluid, pleural fluid, nipple aspirates, lymph fluid, fluid of the respiratory, intestinal, and genitourinary tracts, tear fluid, saliva, breast milk, fluid from the lymphatic system, semen, intra-organ system fluid, ascitic fluid, tumor cyst fluid, amniotic fluid and combinations thereof, and environmental samples such as ground water or waste water, soil extracts, air, and pesticide residues or food-related samples.

Detected substances can include, e.g., nucleic acids (including DNA and RNA), hormones, different pathogens (including a biological agent that causes disease or illness to its host, such as a virus (e.g., H7N9 or HIV), a protozoan (e.g., Plasmodium-causing malaria), or a bacteria (e.g., E. coli or Mycobacterium tuberculosis)), proteins, antibodies, various drugs or therapeutics or other chemical or biological substances, including hydrogen or other ions, non-ionic molecules or compounds, polysaccharides, small chemical compounds such as chemical combinatorial library members, and the like. Detected or determined parameters may include but are not limited to, e.g., pH changes, lactose changes, changing concentration, particles per unit time where a fluid flows over the device for a period of time to detect particles, e.g., particles that are sparse, and other parameters.

As used herein, the term "immobilized," when used with respect to, e.g., a capture reagent, includes substantially attaching the capture reagent at a molecular level to a surface. For example, a capture reagent may be immobilized to a surface of the back-side dielectric layer using adsorption techniques including non-covalent interactions (e.g., electrostatic forces, van der Waals, and dehydration of hydrophobic interfaces) and covalent binding techniques where functional groups or linkers facilitate attaching the capture reagent to the surface of the back-side dielectric layer. Immobilizing a capture reagent to a surface of a back-side dielectric layer may be based upon the properties of the surface, the medium carrying the capture reagent, and the properties of the capture reagent. In some cases, a surface of the back-side dielectric layer may be first modified to have functional groups bound thereto. The functional groups may then bind to biomolecules or biological or chemical substances to immobilize them thereon.

The term "nucleic acid" generally refers to a set of nucleotides connected to each other via phosphodiester bond and refers to a naturally occurring nucleic acid to which a naturally occurring nucleotide existing in nature is connected, such as DNA comprising deoxyribonucleotides having any of adenine, guanine, cytosine, and thymine connected to each other and/or RNA comprising ribonucleotides having any of adenine, guanine, cytosine, and uracil connected to each other. In addition, non-naturally occurring nucleotides and non-naturally occurring nucleic acids are within the scope of the nucleic acid as that term is used herein. Examples include peptide nucleic acids (PNA), peptide nucleic acids with phosphate groups (PHONA), bridged nucleic acids/locked nucleic acids (BNA/LNA), and morpholino nucleic acids. Further examples include chemically-modified nucleic acids and nucleic acid analogues, such as methylphosphonate DNA/RNA, phosphorothioate DNA/RNA, phosphoramidate DNA/RNA, and 2'-O-methyl DNA/RNA. Nucleic acids include those that may be modified. For example, a phosphoric acid group, a sugar, and/or a base in a nucleic acid may be labeled as necessary. Any substances for nucleic acid labeling known in the art can be used for labeling. Examples thereof include but are not limited to radioactive isotopes (e.g., 32P, 3H, and 14C), DIG, biotin, fluorescent dyes (e.g., FITC, Texas, cy3, cy5, cy7, FAM, HEX, VIC, JOE, Rox, TET, Bodipy493, NBD, and TAMRA), and luminescent substances (e.g., acridinium ester).

Aptamer as used herein refers to oligonucleic acids or peptide molecules that bind to a specific target molecule. The concept of using single-stranded nucleic acids (aptamers) as affinity molecules for protein binding was initially disclosed in 1990 (Ellington and Szostak 1990, 1992; Tuerk and Gold 1990), and is based on the ability of short sequences to fold, in the presence of a target, into unique, three-dimensional structures that bind the target with high affinity and specificity. Eugene W. M Ng et al. 2006, discloses that aptamers are oligonucleotide ligands that are selected for high-affinity binding to molecular targets.

The term "protein" generally refers to a set of amino acids linked together usually in a specific sequence. A protein can be either naturally-occurring or man-made. As used herein, the term "protein" includes amino acid sequences, as well as amino acid sequences that have been modified to contain moieties or groups such as sugars, polymers, metalloorganic groups, fluorescent or light-emitting groups, moieties or groups that enhance or participate in a process such as intramolecular or intermolecular electron transfer, moieties or groups that facilitate or induce a protein into assuming a particular conformation or series of conformations, moieties or groups that hinder or inhibit a protein from assuming a particular conformation or series of conformations, moieties or groups that induce, enhance, or inhibit protein folding, or other moieties or groups that are incorporated into the amino acid sequence and that are intended to modify the sequence's chemical, biochemical, or biological properties. As used herein, proteins include, but are not limited to, enzymes, structural elements, antibodies, hormones, electron carriers, and other macromolecules that are involved in processes such as cellular processes or activities. Proteins typically have up to four structural levels that include primary, secondary, tertiary, and quaternary structures.

The term "antibody" as used herein refers to a polypeptide of the immunoglobulin family that is capable of binding a corresponding antigen non-covalently, reversibly, and in a specific manner. For example, a naturally occurring IgG antibody is a tetramer comprising at least two heavy (H) chains and two light (L) chains inter-connected by disulfide bonds. Each heavy chain is comprised of a heavy chain variable region (abbreviated herein as VH) and a heavy chain constant region. The heavy chain constant region is comprised of three domains, CH1, CH2 and CH3. Each light chain is comprised of a light chain variable region (abbreviated herein as VL) and a light chain constant region. The light chain constant region is comprised of one domain, CL. The VH and VL regions can be further subdivided into regions of hypervariability, termed complementarity deteirnining regions (CDR), interspersed with regions that are more conserved, termed framework regions (FR). Each VH and VL is composed of three CDRs and four FRs arranged from amino-terminus to carboxy-terminus in the following order: FR1, CDR1, FR2, CDR2, FR3, CDR3, and FR4. The three CDRs constitute about 15-20% of the variable domains. The variable regions of the heavy and light chains contain a binding domain that interacts with an antigen. The constant regions of the antibodies may mediate the binding of the immunoglobulin to host tissues or factors, including various cells of the immune system (e.g., effector cells) and the first component (C1q) of the classical complement system. (Kuby, Immunology, 4th ed., Chapter 4. W. H. Freeman & Co., New York, 2000).

The term "antibody" includes, but is not limited to, monoclonal antibodies, human antibodies, humanized antibodies, chimeric antibodies, and anti-idiotypic (anti-Id) antibodies (including, e.g., anti-Id antibodies to antibodies of the invention). The antibodies can be of any isotype/class (e.g., IgG, IgE, IgM, IgD, IgA and IgY), or subclass (e.g., IgG1, IgG2, IgG3, IgG4, IgA1 and IgA2).

The term "antigen binding fragment," as used herein, refers to one or more portions of an antibody that retain the ability to specifically interact with (e.g., by binding, steric hindrance, stabilizing/destabilizing, spatial distribution) an epitope of an antigen. Examples of binding fragments include, but are not limited to, single-chain Fvs (scFv), camelid antibodies, disulfide-linked Fvs (sdFv), Fab fragments, F(ab') fragments, a monovalent fragment consisting of the VL, VH, CL and CH1 domains; a F(ab)2 fragment, a bivalent fragment comprising two Fab fragments linked by a disulfide bridge at the hinge region; a Fd fragment consisting of the VH and CH1 domains; a Fv fragment consisting of the VL and VH domains of a single arm of an antibody; a dAb fragment (Ward et al., Nature 341:544-546, 1989), which consists of a VH domain; and an isolated complementarity determining region (CDR), or other epitope-binding fragments of an antibody.

Furthermore, although the two domains of the Fv fragment, VL and VH, are coded for by separate genes, they can be joined, using recombinant methods, by a synthetic linker that enables them to be made as a single protein chain in which the VL and VH regions pair to form monovalent molecules (known as single chain Fv ("scFv"); see, e.g., Bird et al., Science 242:423-426, 1988; and Huston et al., Proc. Natl. Acad. Sci. 85:5879-5883, 1988). Such single chain antibodies are also intended to be encompassed within the term "antigen binding fragment." These antigen binding fragments are obtained using conventional techniques known to those of skill in the art, and the fragments are screened for utility in the same manner as are intact antibodies.

Antigen binding fragments can also be incorporated into single domain antibodies, maxibodies, minibodies, single domain antibodies, intrabodies, diabodies, triabodies, tetrabodies, v-NAR and bis-scFv (see, e.g., Hollinger and Hudson, Nature Biotechnology 23:1126-1136, 2005). Antigen binding fragments can be grafted into scaffolds based on polypeptides such as fibronectin type III (Fn3) (see U.S. Pat. No. 6,703,199, which describes fibronectin polypeptide monobodies).

Antigen binding fragments can be incorporated into single chain molecules comprising a pair of tandem Fv segments (VH-CH1-VH-CH1) which, together with complementary light chain polypeptides, form a pair of antigen binding regions (Zapata et al., Protein Eng. 8:1057-1062, 1995; and U.S. Pat. No. 5,641,870).

The term "monoclonal antibody" or "monoclonal antibody composition" as used herein refers to polypeptides, including antibodies and antigen binding fragments that have substantially identical amino acid sequence or are derived from the same genetic source. This term also includes preparations of antibody molecules of single molecular composition. A monoclonal antibody composition displays a single binding specificity and affinity for a particular epitope.

The term "nanoparticles" refers to atomic, molecular or macromolecular particles typically in the length scale of approximately 1-100 nanometer range. Typically, the novel and differentiating properties and functions of nanoparticles are observed or developed at a critical length scale of matter typically under 100 nm. Nanoparticles may be used in constructing nanoscale structures and they may be integrated into larger material components, systems and architectures. In some particular cases, the critical length scale for novel properties and phenomena involving nanoparticles may be under 1 nm (e.g., manipulation of atoms at approximately 0.1 nm) or it may be larger than 100 nm nanoparticle reinforced polymers have the unique feature at approximately 200-300 nm as a function of the local bridges or bonds between the nanoparticles and the polymer).

The term "nucleation composition" refers to a substance or mixture that includes one or more nuclei capable of growing into a crystal under conditions suitable for crystal formation. A nucleation composition may, for example, be induced to undergo crystallization by evaporation, changes in reagent concentration, adding a substance such as a precipitant, seeding with a solid material, mechanical agitation, or scratching of a surface in contact with the nucleation composition.

The term "particulate" refers to a cluster or agglomeration of particles such as atoms, molecules, ions, dimers, polymers, or biomolecules. Particulates may comprise solid matter or be substantially solid, but they may also be porous or partially hollow. They may contain a liquid or gas. In addition, particulates may be homogeneous or heterogeneous, that is, they may comprise one or more substances or materials.

The term "polymer" means any substance or compound that is composed of two or more building blocks ('mers') that are repetitively linked to each other. For example, a "dimer" is a compound in which two building blocks have been joined together. Polymers include both condensation and addition polymers. Typical examples of condensation polymers include polyamide, polyester, protein, wool, silk, polyurethane, cellulose, and polysiloxane. Examples of addition polymers are polyethylene, polyisobutylene, polyacrylonitrile, poly(vinyl chloride), and polystyrene. Other examples include polymers having enhanced electrical or optical properties (e.g., a nonlinear optical property) such as electroconductive or photorefractive polymers, the term polymer as used herein, includes both linear and branched polymers.

Overview

On-chip heaters in accordance with this disclosure provide improved uniformity of heat distribution in portions of a chip in which they operate. In a variety of on-chip sensor applications, temperature control of the sensing region is useful to promote or initiate a reaction. For such applications, a suitable on-chip heater should exhibit several desired characteristics such as temperature control, temperature uniformity within 1° C., low power consumption and ease of integration.

The physical configuration of an on-chip heater is a factor in achieving the desired temperature uniformity. Rectangular configurations for on-chip heaters suffer from undesirable center to edge temperature gradients. Meanwhile single circular configuration heaters, even though they exhibit relatively improved temperature uniformity still suffer from current and power distribution issues, and typically require larger operating voltages compared to rectangular configurations.

Dual Gate Back-Side FET Sensor

FIG. 1A is a cross-sectional view of an exemplary DG-BSS FET 100 suitable for use in an application in which heat is applied to a target analyte disposed in an opening 120. DG-BSS FET 100 may be configured to perform as a pH sensor, a chemical sensor, a biosensor, a gas sensor or any similar sensor.

DG-BSS FET 100 has an active region 102 which has a first surface 102a in contact with a dielectric material 104, and a second surface 102b in contact with a dielectric material 106. Active region 102 comprises a semiconductor material, in this example silicon. However, other semiconductor materials may be used, such as III-V semiconductor compounds and combinations thereof. Active region 102 may be, as in this example, the top Si layer of a silicon in insulator (SOI) wafer having a thickness range between 5 and 30 nm. Alternatively, active region 102 may be the top surface of a bulk substrate. Dielectric material 104 may be selected from dielectrics such as, but not limited to, $SiO_2$, a stack of dielectric materials including $SiO_2$, silicon nitride ($Si_3N_4$), low dielectric constant (low-k) materials and any combination of thereof, or any other combination of suitable dielectric materials. Dielectric material 106 may be, as in this example, part of the buried oxide (BOX) layer of an SOI substrate and may be selected from dielectrics such as, but not limited to, $SiO_2$.

A first S/D 108 and a second S/D 110 are disposed in active region 102, with a channel region 112 disposed between first S/D 108 and second S/D 110. A first shallow trench isolation (STI) structure 126 and a second STI structure 128 are disposed on a side of first S/D 108 and a side of second S/D 110 respectively as shown in FIG. 1A. On a first surface 102a of active region 102 and in contact with the channel region 112, a primary gate stack 114 is formed. Primary gate stack 114 is surrounded by dielectric material 104. Primary gate stack 114 further includes a first gate dielectric layer 116, disposed on channel region 112, and a gate electrode 118. In this illustrative embodiment, gate electrode 118 is doped polysilicon. In alternative embodiments gate electrode 118 may be formed from other electrically conductive material such as a metal, or a stack of metal layers with appropriate workfunction. In this illustrative embodiment, first gate dielectric 116 is $SiO_2$. In alternative embodiments first gate dielectric 116 may be selected from dielectric materials such as silicon oxynitride ($SiO_xN_y$), hafnium oxide ($HfO_2$), hafnium silicate ($Hf_xSi_yO_z$) or any other suitable high-k dielectric material or combinations of thereof.

Electrical connections to gate electrode 118, and first and second S/Ds 108, 110 are provided through contact lines, via lines and interconnects which are not shown in FIG. 1A for simplicity. The contact lines contain a metal such as tungsten (W). Vias contain metals such as titanium-aluminum alloy (TiAl) or W, and interconnects contain low resistance metals such as copper (Cu) or aluminum (Al). Contact lines, vias and interconnects are formed in dielectric material 104 after several photolithography, dry etch, and clean operations followed by several metal deposition and chemical mechanical polishing (CMP) operations. In addition, the sidewalls of gate stack 114 are covered with sidewall spacers 124.

An opening 120 is formed in dielectric layer 106, above channel region 112, to expose second surface 102b of channel region 112. A second dielectric layer 122 is disposed on channel region 112. In this exemplary embodiment, second dielectric layer 122 may cover all surfaces of opening 120. However, dielectric layer 122 may be engineered to grow only on channel region 112. An capture reagent 130 is immobilized on second dielectric layer 122. In this illustrative embodiment, second dielectric layer 122 is $HfO_2$, or any other suitable dielectric layer. Immobilized capture reagent 130 is a molecule or compound capable of binding the target analyte or target reagent, which can be directly or indirectly attached to a substantially solid material. Immobilized capture reagent 130 can be a chemical, and specifically any substance for which there exists a naturally occurring target analyte (e.g., an antibody, polypeptide, DNA, RNA, cell, virus, etc.) or for which a target analyte can be prepared, and the capture reagent can bind to one or more target analytes in an assay. Opening 120 along with dielectric layer 122 and immobilized capture reagent 130 serve as a reaction-site well for the target analyte.

Figure 1B:
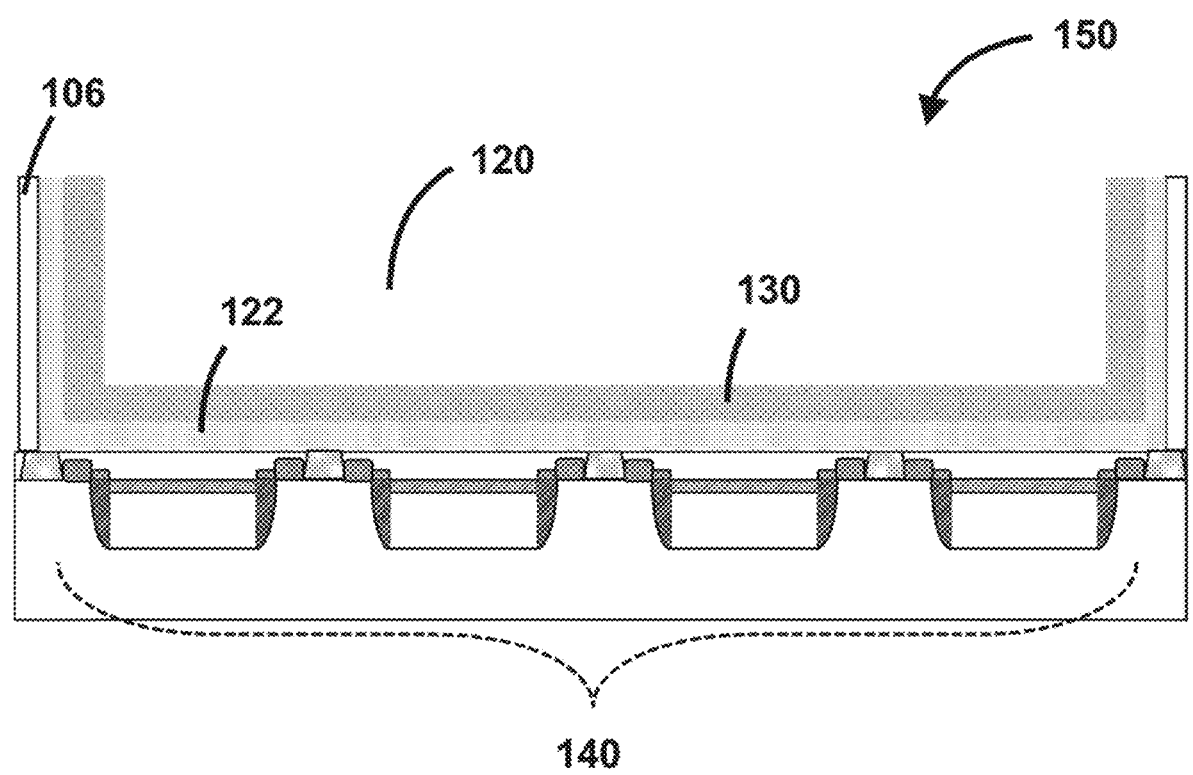
FIG. 1B is cross-sectional view of an exemplary sensor array.

FIG. 1B shows a cross-sectional view of an exemplary array of DG-BSS FETs 150, wherein opening 120 extends over a plurality of DG-BSS FETs 140. When the target analyte is introduced to opening 120, charge accumulates at the interface between immobilized capture reagent 130 and second dielectric layer 122. The charge accumulation will cause $I_{ds}$ changes to DG-BSS FETs of array 150. In this array of DG-BSS FETs 150 the opening extends over four DG-BSS FETs. In other embodiments opening 120 may extend over a larger number of DG-BSS FETs.

Figure 2:
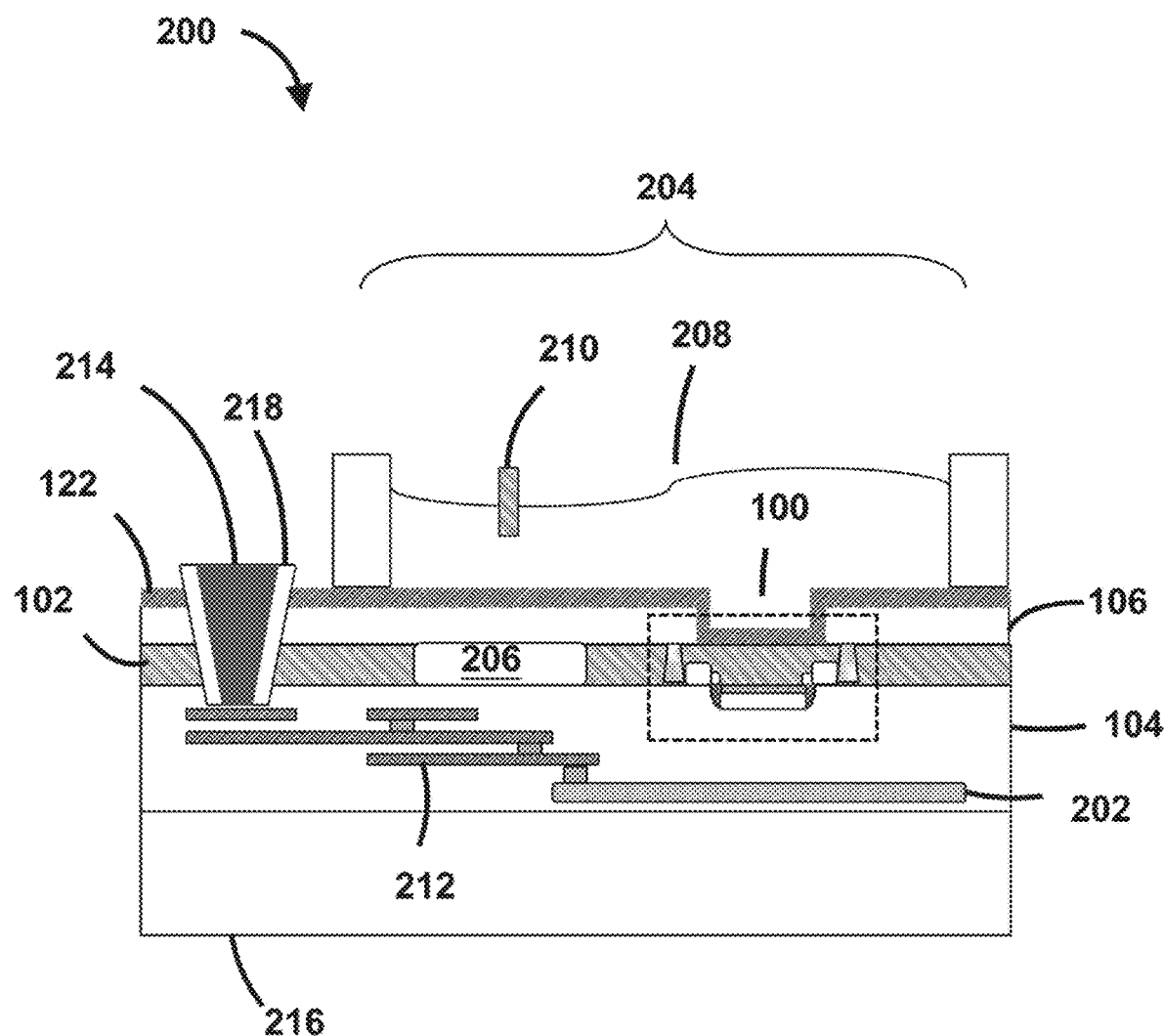
FIG. 2 is cross-sectional view of an exemplary apparatus having a sensor, a fluidic channel, a heater and a temperature sensor.

FIG. 2 is a cross-sectional view of an exemplary apparatus 200 that includes DG BSS FET 100 and additional elements, such as a heater 202, a fluidic channel 204 and a temperature sensor 206. In some embodiments heater 202 provides heating to fluidic channel 204 with uniformity within 1.5° C. or less and includes a plurality of heating elements. In some embodiments the impact of this thermal input is to promote or initiate a chemical reaction. In this illustrative embodiment, heater 202 is an electric-resistive heater with a resistor formed from a layer of titanium aluminum nitride (TiAlN). In alternative embodiments, the resistor can be formed from polysilicon, tungsten silicide ($WSi_x$), or any other conductor with suitable sheet resistance. In some embodiments, the thickness of heater 202 ranges from 56 to 66 nm. However, the thickness of heater 202 may not be so limited. In some embodiments, the nominal sheet resistance for heater 202 is about 4.8 Ω/sq. However, the sheet resistance of heater 202 may not be so limited and may depend on the type of sensor, the desired set point temperature, or other manufacturing considerations as would be understood by those of ordinary skill in the art.

In this illustrative embodiment, power to heater 202 is provided through multilevel interconnects(MLI) 212 which are connected to a via line 214. Via line 214 serves as an electrical connection between heater 202 and an external power supply (not shown in FIG. 2). The heat output of heater 202 depends on the applied power supply voltage and can be therefore controlled independently by the external power supply. Dielectric layer 218 provides electrical insulation to via line 214 from other components, such as for example active region 102. MLI 212 also provides heater's 202 electrical connections to ground (not shown in FIG. 2 for simplicity). Electrical connections between heater's 202 heating elements at various location points are also provided by MLI 212 as it will be discussed later. MLI 212 include local interconnects connected through vias. In this exemplary embodiment, local interconnects contain low resistance metals such as Cu or Al while the vias contain metals such as TiAl or W.

Temperature sensor 206 provides feedback about the temperature of sample 208 in fluidic channel 204 so that the power to heater 202 can be adjusted to achieve and sustain the desired temperature set point. In one embodiment, temperature sensor 206 is a diode. In another embodiment, a control loop may be created to control the temperature using heater 202 and the feedback received from temperature sensor 206. For example, for a bio-sensor the desired temperature range is between room temperature and 100° C. depending on the biological material under analysis, while for gas or chemical sensors the temperature required may be several hundred degrees Celsius.

Reference electrode 210 provides a reference electric potential when there is no chemical reaction taking place in sample 208. In this illustrative embodiment, reference electrode 210 can be Ag, AgCl, Au, Pt or any other suitable metal. Under dry sensing conditions, such as in a gas sensor, the reference electrode is not utilized. Mechanical support of apparatus 200 is provided by handle substrate 216 which, in this exemplary embodiment, is bonded to dielectric material 104 after the fabrication of heater 202 and before the fabrication of opening 120. Handle substrate 216 comprises silicon, glass, or any other material that is compatible with CMOS fabrication methods and provides mechanical support to the apparatus during the formation of opening 120 and fluidic channel 204.

Chemistry and Biology

The apparatus, systems, and methods of described in this application can be used to detect and/or monitor interactions between various entities. These interactions include biological and chemical reactions to detect target analytes in a test sample. As an example, reactions, including physical, chemical, biochemical, or biological transformations, can be monitored to detect generation of intermediates, byproducts, products, and combinations thereof. In addition the apparatus, systems, and methods of the invention can be used to detect these reactions in various assays as described herein, including, but not limited to, circulating tumor cell assays used in liquid biopsies and chelation assays to detect the presence of heavy metals and other environmental pollutants. Such assays and reactions can be monitored in a single format or in an array format to detect, e.g., multiple target analytes.

Heater

The temperature uniformity provided by a heater depends strongly on its physical layout, or configuration. Rectangular layouts suffer from undesirable temperature gradients between their center and peripheral edges. As a result, such heater configurations exhibit a significant center-to-edge temperature drop. Single circular layout heaters exhibit relatively improved temperature uniformity but still suffer from current and power distribution issues, and typically require larger operating voltages compared to the rectangular layouts.

Figure 3A:
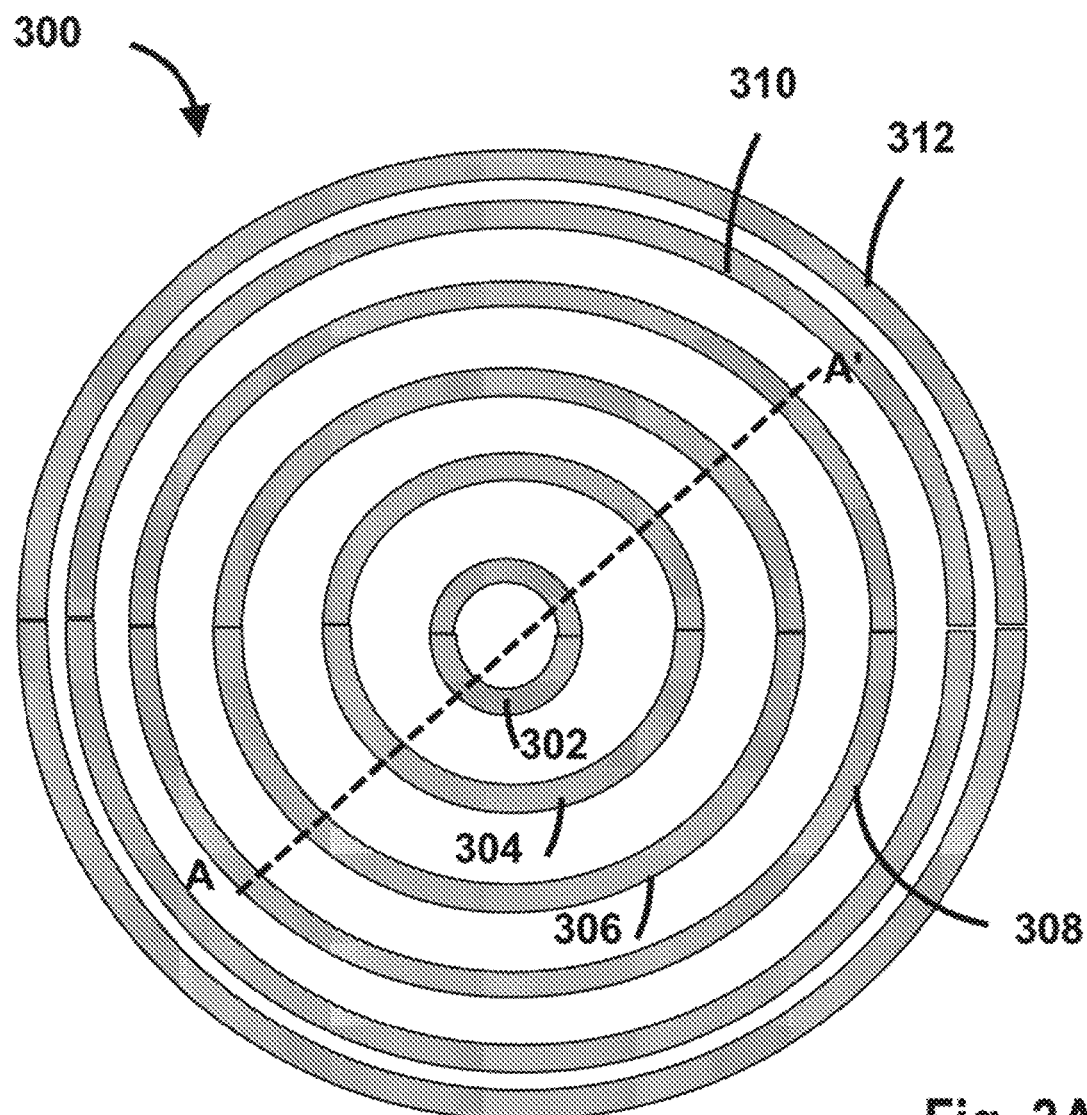
FIG. 3A is an exemplary heating element configuration in accordance with the disclosure.
Figure 3B:
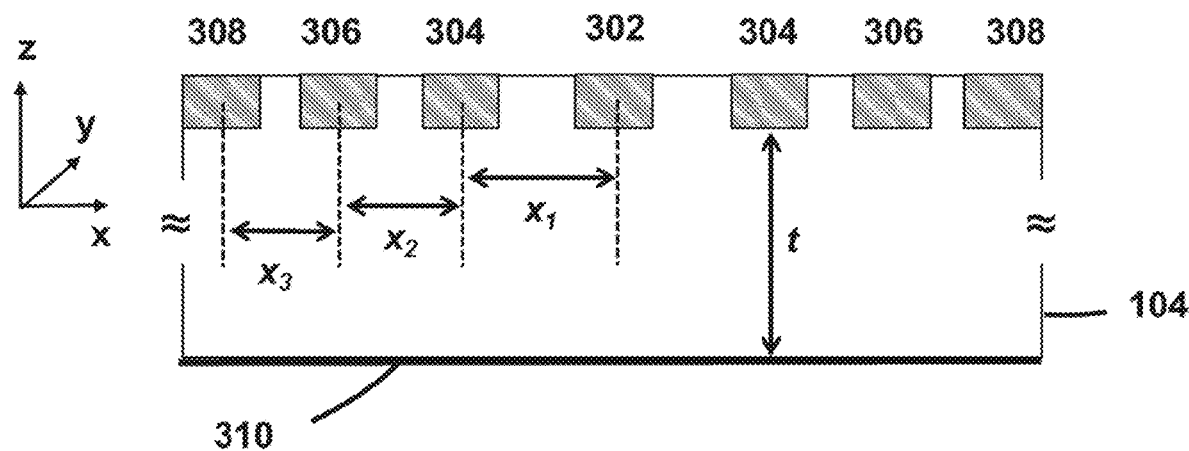
FIG. 3B is cross-sectional view of an exemplary heating element configuration in accordance with the disclosure.

A heater in accordance with this disclosure includes a plurality of individual heating elements arranged in a concentric rings configuration. Such a configuration, or layout, of heating elements has several advantages over other layouts. Various embodiments in accordance with this disclosure use polynomial compensation to determine the spacing between the heating elements to improve temperature distribution across the heater. For example, FIG. 3A shows a top view of an exemplary heater 300 having heating elements 302, 304, 306, 308, 310, and 312. FIG. 3B is a cross-sectional view of exemplary heater 300 taken along the dotted line AA' of FIG. 3A. In FIG. 3B, heater elements 302 through 312 are surrounded by dielectric material 104. $x_1$, $x_2$ and $x_3$ are the distances (spacing) between heating elements 302 and 304, 304 and 306, and 306 and 308 respectively. In any heater configuration there is heat dissipation towards thermal ground 314 located at a distance t from the heating elements. The temperature differential between each heating element and thermal ground 314 strongly depends on the material surrounding the heating elements, such as the dielectric material 104, and the spacing between the neighboring heating elements $x_1$, $x_2$ and $x_3$. For example, the differential temperature equations for heating elements 302 and 304 have the general form:

$$\Delta T_{302} = D\frac{t}{k}\left[(1-\alpha-\beta) + a\frac{Az}{Ax}\frac{x_1}{t} + \beta\frac{Az}{Ax}\frac{x_1+x_2}{t}\right]$$

$$\Delta T_{304} = D\frac{t}{k}\left[(1-\alpha-\beta) + a\frac{Az}{Ax}\frac{x_2}{t} + \beta\frac{Az}{Ax}\frac{x_2+x_3}{t}\right]$$

Where D is the heat flow density, k is the thermal conductivity of the surrounding material such as dielectric 104, $x_i$ (i=1,2,3) is the distance between adjacent heating elements in the x-direction, t is the distance between the heater element and thermal ground 314, Az is a plane perpendicular to the z direction, Ax is a plane perpendicular to the x direction, term α is the fraction of the heat transfer from a first heater in the x-direction, term β is the fraction of the heat transfer from an adjacent second heater in the x-direction, and term (1-α-β) is the fraction of the heat transfer towards thermal ground 314 in the z-direction from the first heater and the second adjacent heater. In order to approach temperature uniformity across the heater, the temperature differentials $\Delta T_{302}$ and $\Delta T_{304}$ need to be equal. For example, in the case of heating elements 302 and 304 this means $$a\frac{Az}{Ax}\frac{x_1}{t} + \beta\frac{Az}{Ax}\frac{x_1+x_2}{t} = a\frac{Az}{Ax}\frac{x_2}{t} + \beta\frac{Az}{Ax}\frac{x_2+x_3}{t}$$

Making an appropriate selection of heating element spacing $x_1$, $x_2$ and $x_3$, the temperature differential for heating elements 302 and 304 can be nominally equal. Applying the same principle to all heating elements, the spacing between the heating elements can be selected to achieve greater temperature uniformity across the heater than would be achieved with equal spacing between heating elements.

Figure 4:
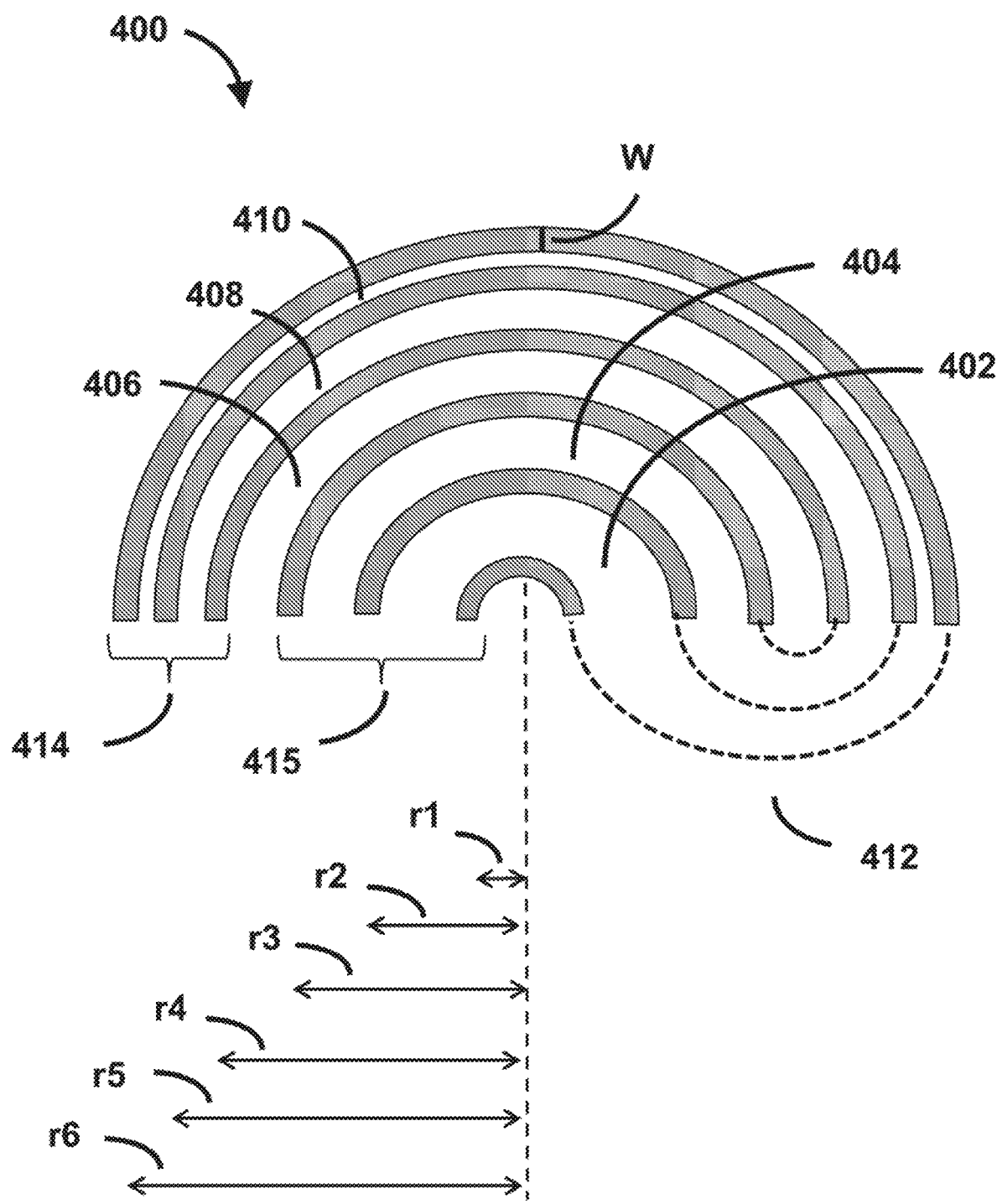
FIG. 4 is a top view of a section of an exemplary heater in accordance with the disclosure.

FIG. 4 is a top view of a section of an exemplary heater 400 in accordance with this disclosure. In this exemplary illustrative embodiment, heater 400 is shown to have six heating elements. Alternative embodiments may have more heating elements, and by way of example and not limitation, 200 heating elements are possible. Each spacing 402 through 410 between the heating elements has been selected using polynomial compensation. As a result, the spacing between the heating elements gradually gets smaller as the radius of the heating element increases. For example, spacing 402 is the largest while spacing 410 is the smallest.

To ensure that the electric current flowing through each section of the heater is nominally equal, the length of each heating element needs to be taken into consideration. This is accomplished by electrically connecting the heating elements in such a way that the radii of the heating elements (r1 through r6) satisfy the following relationship:

$$r1+r6=r2+r5=r3+r4$$

This suggests that it is desirable to electrically connect the heating elements so that the total resistance across each group of connected heating elements is nominally equal. This is accomplished by connecting the first heating element with the shortest radius r1 to the heating element with the largest radius r6 through electrical connections 412. Similarly, the second and the fifth heating elements are connected, and the third to the fourth through electrical connections 412 as shown in FIG. 4. Electrical connections 412 have lower resistance compared to the heating elements and their contribution to the overall heater resistance is negligible. In operation the three outer heating elements 414 are connected to a voltage source while the three inner heating element rings 415 are connected to ground. Electrical connections 412 are part of MLI 212.

In one embodiment, to ensure nominally uniform current density through each heating element, heating element width W is limited to 30 μm or less. As the number of heating elements increases and the width of each heater W decreases, the operating voltage of the heating element is reduced while the temperature uniformity improves. For example, a 16 ring heater, with 30 μm heating element width W requires an operating voltage of 3.5 V and exhibits a radial temperature uniformity of about 1.5° C. from center to edge. If the number of rings increases to 44 and the width of the each heating element W is reduced to 20 μm, then the operating voltage required will drop to 2 volts and the radial temperature uniformity is improved to about 1° C.

Figure 5A:
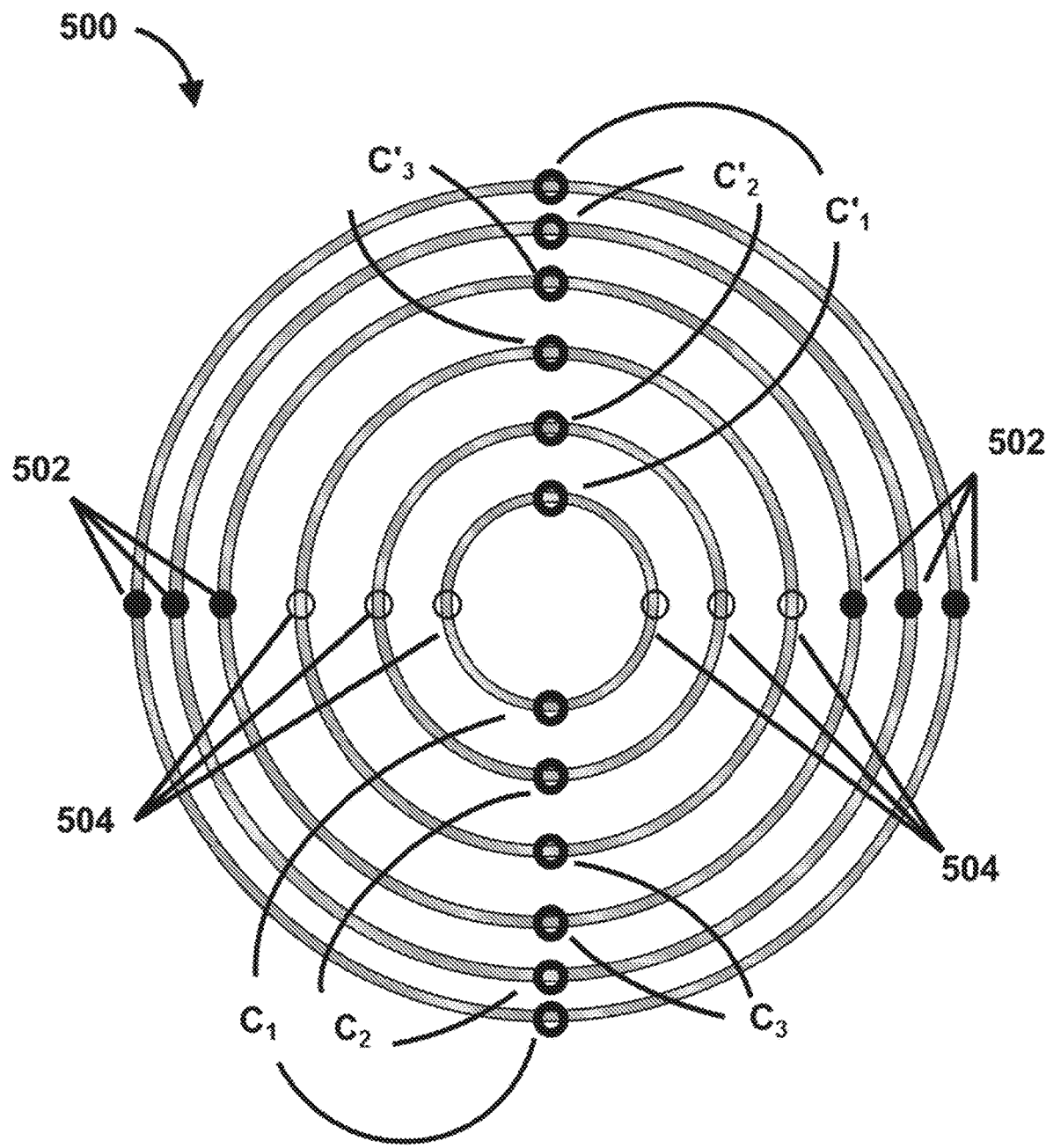
FIG. 5A is an exemplary heater in accordance with the disclosure.
Figure 5B:
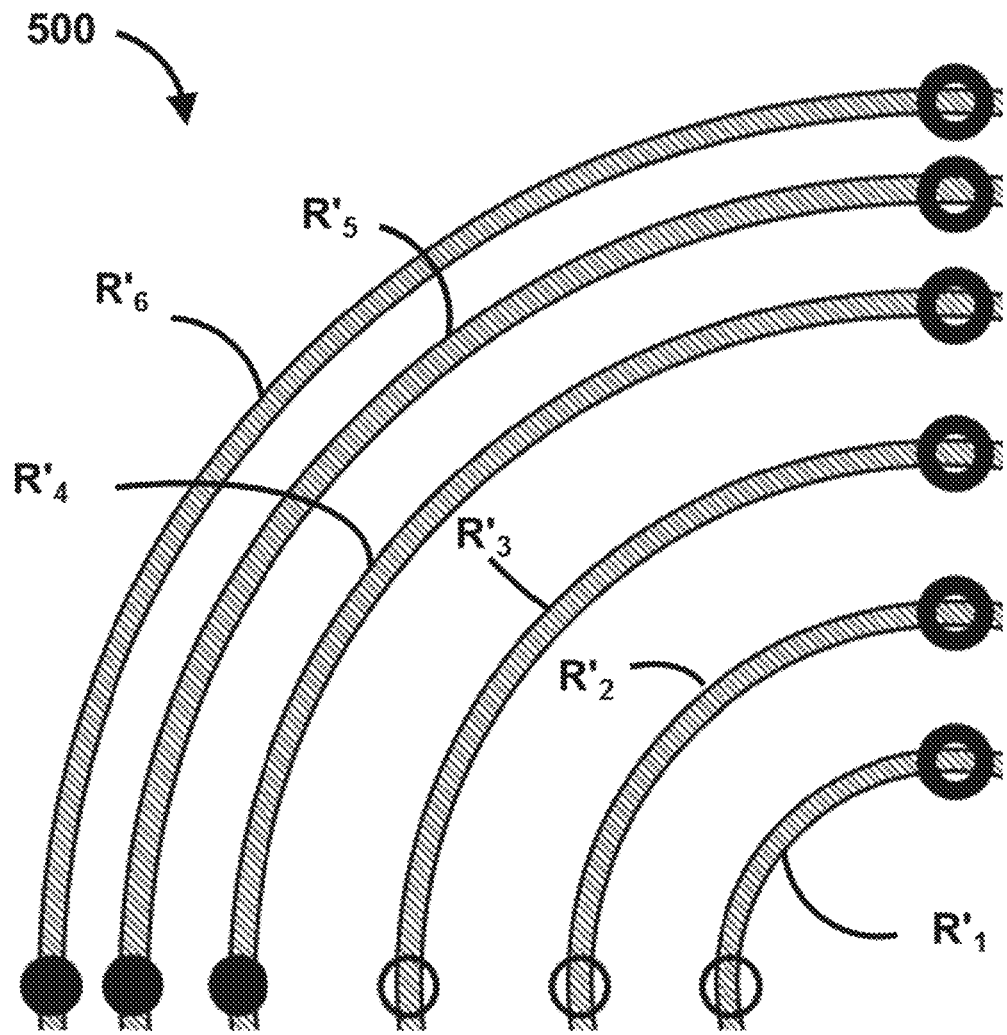
FIG. 5B is a top view of a section of an exemplary heater in accordance with the disclosure.

The concentric rings layout allows electrical connection variations to address any voltage supply restrictions. For example, by adding additional electrical connection points with the use of vias and MLI 212 to the heater elements their total resistance is divided into smaller resistances, and the supply voltage $V_{DD}$ required is reduced; meanwhile the electric power consumed by the heater remains the same. FIG. 5A shows an exemplary heater 500. Heater 500 may be similar to exemplary heaters 300 or 400. In this example, the connections to the heater elements have been made such that the resistance of each ring has been divided into 4 smaller resistances. In FIG. 5A connection points 502 and 504 are where supply voltage $V_{DD}$ and ground connections are made respectively. Electrical connection points $C_1$, $C_2$, $C_3$, and additional set of electrical connection points $C'_1$, $C'_2$, $C'_3$ are made to electrically connect the heating element rings so that the total resistance across each pair of electrically connected heating elements is the same. In the illustrative embodiment of FIG. 5A the connection points between $C_1$, $C_2$, $C_3$ and $C'_1$, $C'_2$, $C'_3$, as well as between supply voltage $V_{DD}$ 502 and ground connection 504, are placed co-linearly in the same radial plane respectively as shown in FIG. 5A. This connection configuration allows the total resistance of each heating element ring to be divided into 4 smaller resistances between the connection points as shown in FIG. 5B, which depicts a section of heater 500. So in this case:

$$R'_1=R_1/4,\ R'_2=R_2/4,\ R'_3=R_3/4,\ R'_5=R_5/4,\ R'_6=R_6/4$$

where $R_1$, $R_2$, $R_3$, $R_4$ and $R_5$ are the total resistances of each corresponding heating element ring. Assuming that the amount of power consumed by the heater does not change, the new supply voltage required ($V'_{DD}$) with the addition of a new set of connection points $C'_1$, $C'_2$, $C'_3$ will be only a fraction $$\left(\frac{1}{\sqrt{2}}\right)$$

of the original applied voltage ($V_{DD}$).

Figure 6:
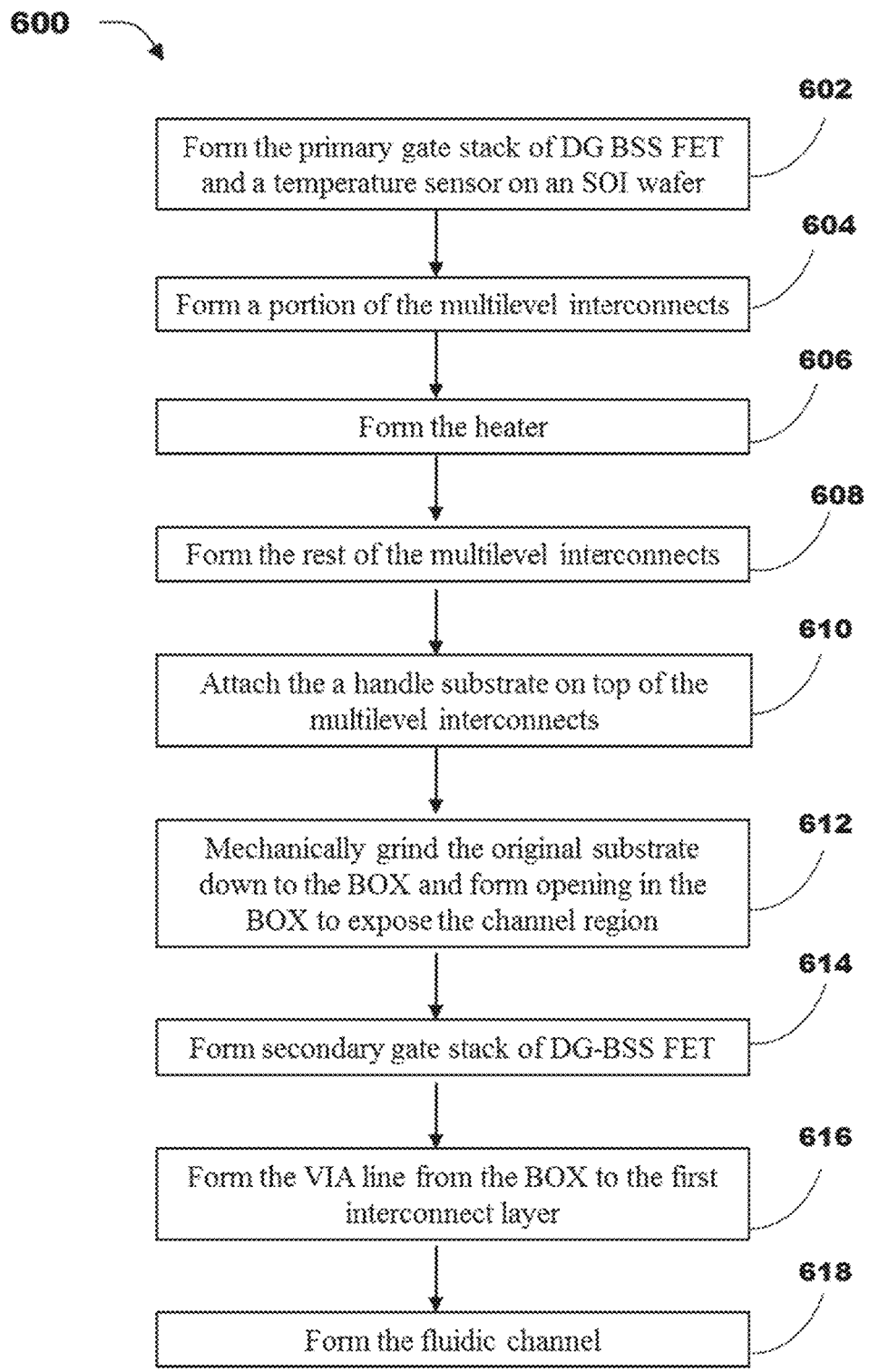
FIG. 6 is a flow chart of an exemplary integrated on-chip heater fabrication according to the disclosure.

Exemplary fabrication process 600 shown in FIG. 6, describes the fabrication steps of an exemplary integrated on-chip heater. Other fabrication steps may be performed between the various steps of method 600, and are omitted merely for clarity. The fabrication process 600 is not limited to the example provided herein.

Fabrication process 600 starts with step 602 and the formation of the DG-BSS FET's primary stack 114 and temperature sensor 206 on active region 102. In exemplary fabrication process 600, active region 102 is the top thin Si layer of an SOI wafer having a thickness range between 5 to 30 nm. However, other semiconductor materials may be used to form active region 102, such as III-V semiconductor compounds and combinations thereof. In addition, bulk Si substrates may also be used. During step 602 additional elements of the DG-BSS FET are formed, such as the first and second S/D 108 and 110, channel region 112, and spacers 124. Contact lines with W metal are also formed at this step to allow connections to primary gate stack 114 and first and second S/Ds 108 and 110. The contact lines are formed in dielectric material 104 after several photolithography, dry etch, and clean operations followed by several metal deposition and chemical mechanical polishing (CMP) operations.

In step 604 a portion of MLI 212 is formed and surrounded by dielectric material 104. Dielectric material 104 may be selected from dielectrics such as, but not limited to, $SiO_2$, a stack of dielectric materials including $SiO_2$, silicon nitride ($Si_3N_4$), low dielectric constant (low-k) materials and any combination of thereof, or any other combination of suitable dielectric materials. MLI 212 includes local interconnects connected through vias. MLI 212 contains low resistance metals such as Cu or Al while the vias contain metals such as TiAl or W. MLI 212 are connected to gate electrode 118, first and second S/Ds 108 and 110 through the contact lines mentioned earlier.

In step 606 the heater is formed. Heater 202 is an electric-resistive heater with a resistor formed from a layer of polysilicon. In alternative embodiments, the resistor can be formed from titanium aluminum nitride (TiAlN), tungsten silicide ($WSi_x$), or any other conductor with suitable sheet resistance. In some embodiments, the thickness of heater 202 ranges from 56 to 66 nm. However, the thickness of heater 202 may not be so limited. In some embodiments, the nominal sheet resistance for heater 202 is about 4.8 Ω/sq. However, the sheet resistance of heater 202 may not be so limited and may depend on the type of sensor, the desired set point temperature, or other manufacturing considerations as would be understood by those of ordinary skill in the art. Heater 202 in accordance with this disclosure includes individual heating elements arranged in a concentric rings configuration. Such a configuration, or layout, of heating elements has several advantages over other layouts. Various embodiments in accordance with this disclosure use polynomial compensation to determine the spacing between the heating elements to improve temperature distribution across the heater. For example the spacing between the rings decreases radially from center to edge. To ensure that the electric current flowing through each section of the heater is nominally constant, each heating element is connected electrically through contact lines to other heating elements within the same concentric rings configuration such that the total resistance across each group of connected heating elements is nominally equal. Adding new electrical contact points for the electrical connections between heating elements, the total resistance is divided into smaller resistances, and the supply voltage required is reduced while the power consumed by the heater remains the same. For uniform current density through each heating element, heating element width W is limited to 30 μm or less according to the disclosure.

In step 608 the rest of the MLI are formed. This step is optional depending on the chip design. Formation of MLI in this step follows similar fabrication operations as in step 604.

In step 610 a handle substrate 216 is attached to the free surface of dielectric material 104, on top of the MLI 212 and heater 202. Handle substrate 216 comprises silicon, glass, or any other material that is compatible with CMOS fabrication methods and provides sufficient mechanical support for the next process steps.

In step 612, the original SOI wafer is turned upside down with the bulk Si layer facing upwards and the handle substrate 216, along with the thin Si layer (active layer 102) and the partially formed DG-BSS FET, facing downward. The bulk silicon layer is mechanically grinded until the buried oxide (BOX) or dielectric material 106 is exposed. BOX or dielectric material 106 is patterned with photolithography and etched to form opening 120 to expose second surface 102b of active region 102, and channel region 112. In some embodiments, opening 120 extents over a plurality of partially formed DG-BSS FETs 140, exposing the second surface 102b of active region 102 and channel region 112 of each partially formed DG-BSS FET in the array.

In step 614 secondary gate stack of the DG-BSS FET including second gate dielectric 122 and immobilized capture reagent 130 are disposed on channel region 112. Second gate dielectric 122 and immobilized capture reagent 130 may also be covering the sidewalls of opening 120 and the BOX or dielectric material 106. Alternatively, gate dielectric 122 and immobilized capture reagent 130 may be covering only channel region 112. With step 614 the DG-BSS FET formation is complete.

In step 616 dielectric material 106 or BOX, active region 102 and dielectric material 104 are etched up to the first level of MLI 212 to form via line 214. Process 600 ends with the formation of fluidic channel 204 in step 618.

DG-BSS FETs enable the avoidance of costly and time-consuming labeling operations such as the labeling of an analyte with, for instance, fluorescent or radioactive probes. The analytes may include any biological or chemical compound, or any element including ions. The physical configuration of an on-chip heater is useful in achieving a desired temperature uniformity. A heater configuration comprising individual heating elements in a concentric rings configuration has several advantages over other layouts. Polynomial compensation is used to determine the spacing between the rings thereby improving temperature uniformity across the heater surface as compared to uniformity achieved with a constant spacing between the rings. In accordance with this disclosure, the spacing between the rings decreases radially from center to edge. To ensure that the electric current flowing through each section of the heater is nominally constant, each heating element is connected electrically through contact lines to other heating elements within the same concentric rings configuration such that the total resistance across each group of connected heating elements is nominally equal. Adding new electrical contact points for the electrical connections between heating elements, the total resistance is divided into smaller resistances, and the supply voltage required is reduced while the power consumed by the heater remains the same. For uniform current density through each heating element, heating element width W is limited to 30 μm or less according to the disclosure.

In one embodiment an integrated circuit includes a common channel region having a first surface and an opposing second surface, a first gate dielectric disposed on the first surface of the common channel region, a first gate electrode disposed over the first gate dielectric, a first source/drain and a second source/drain laterally separated from each other by the common channel region, a second gate dielectric disposed on the second surface of the common channel region, a heater having a plurality of heating elements disposed concentrically with respect to each other; and a temperature sensor. The heater is disposed within the integrated circuit such that is no more than 5 μm from the second gate dielectric. The heater has a surface area of no more than 100 mm². The heater has an operating temperature range from room temperature to 300° C. Each heating element of the plurality of heating elements has an arcuate, or curved, shape, and each heating element of the plurality of heating elements has a corresponding radius from a common point. A number of heating elements in the plurality of heating elements does not exceed 200. Each individual heating element of the plurality of heating elements has a nominal thickness no greater than 0.7 μm. The temperature sensor is used to determine the approximate temperature of the sensing region of a FET sensor, such as a DG-BSS FET.

In another embodiment, a method includes forming a DG-BSS FET that includes a primary gate stack and a secondary gate stack disposed on vertically opposing surfaces of a common channel region; a first source/drain and a second source/drain laterally separated from each other by the common channel region; wherein the primary gate stack has a first gate dielectric disposed on a first surface of the common channel region, and a first gate electrode disposed over the first gate dielectric, the secondary gate stack has a second gate dielectric disposed on the second surface of the common channel region, and a capture reagent disposed on the second gate dielectric; and disposing, in the integrated circuit, a heater having a plurality of concentrically-arranged heating elements, each heating element having a shape that is arcuate, wherein pairs of heating elements are electrically connected to each other; and forming a temperature sensor in thermal communication with the DG-BSS FET.

In a further embodiment, an integrated circuit includes a dual-gate back side sensing field effect transistor having a first source/drain and a second source/drain each disposed in an active region and laterally separated from each other by a channel region, a first gate dielectric disposed on a first surface of the channel region, a gate electrode disposed over the first gate dielectric, and a second gate dielectric disposed on a second surface of the channel region, the first and second surfaces positioned on opposing sides of the channel region; a reaction-site well disposed over the second surface of the channel region; a heater comprising a plurality of concentrically disposed heating elements having a corresponding radius; and a temperature sensor in thermal communication with the dual-gate back side sensing field effect transistor. In this embodiment the adjacent heating elements with different radii are separated by a distance that is predetermined and non-uniform.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a channel region having a first surface and a second surface opposite to the first surface;
a first gate dielectric disposed on the first surface;
a gate electrode disposed on the first gate dielectric;
a first source/drain and a second source/drain disposed in an active region and laterally separated from each other by the channel region;
a second gate dielectric disposed on the second surface;
a dielectric layer disposed on the gate electrode;
a heater having a plurality of heating elements arranged concentrically with respect to each other and positioned within the dielectric layer; and
a temperature sensor disposed within the active region,
wherein each heating element of the plurality of heating elements has an arc shape,
wherein a first distance between a first pair of adjacent inner heating elements of the plurality of heating elements is greater than a second distance between a second pair of adjacent outer heating elements of the plurality of heating elements, and
wherein the first pair of adjacent inner heating elements is separated from the second pair of adjacent outer heating elements by a third distance that is smaller than the first distance and greater than the second distance.

2. The integrated circuit of claim 1, wherein the heater is disposed within the dielectric layer such that the heater is no more than 5 μm from the second gate dielectric.

3. The integrated circuit of claim 1, wherein each heating element of the plurality of heating elements has a circular shape.

4. The integrated circuit of claim 3, wherein a number of heating elements in the plurality of heating elements does not exceed 200.

5. The integrated circuit of claim 1, wherein each heating element of the plurality of heating elements has a width no greater than 30 μm.

6. The integrated circuit of claim 1, wherein each heating element of the plurality of heating elements has a thickness no greater than 0.7 μm.

7. The integrated circuit of claim 1, wherein a fourth distance between a third pair of adjacent outermost heating elements of the plurality of heating elements is smaller than the first, second, and third distances.

8. The integrated circuit of claim 1, further comprising a multilevel interconnect (MLI) structure disposed within the dielectric layer,
wherein the second pair of adjacent outer heating elements are connected to each other through an electrical connection of the MLI structure, and
wherein a resistance of the electrical connection is lower than a resistance of the second pair of adjacent outer heating elements.

9. The integrated circuit of claim 1, wherein an innermost heating element and an outermost heating element of the plurality of heating elements are connected to each other through an electrical connection of a multilevel interconnect (MLI) structure disposed within the dielectric layer, and
wherein a resistance of the electrical connection is lower than resistances of the innermost and outermost heating elements.

10. The integrated circuit of claim 1, wherein each heating element of the plurality of heating elements is connected to a corresponding electrical connection of a multilevel interconnect (MLI) structure disposed within the dielectric layer, and
wherein the corresponding electrical connections are arranged co-linearly in a same plane.

11. An integrated circuit, comprising:
a dual-gate back side sensing field effect transistor (DG-BSS FET) comprising:
a first source/drain (S/D) and a second S/D disposed in an active region and laterally separated from each other by a channel region,
a first gate dielectric disposed on a first surface of the channel region,
a gate electrode disposed on the first gate dielectric, and
a second gate dielectric disposed on a second surface of the channel region, the first and second surfaces positioned on opposing sides of the channel region;
a reaction-site well disposed on the second surface of the channel region;
a heater comprising a plurality of heating elements with radii different from each other and arranged concentrically with respect to each other,
wherein the heater is positioned under the reaction-site well to heat a chemical in the reaction-site well,
wherein a first distance between a first pair of adjacent inner heating elements of the plurality of heating elements is greater than a second distance between a second pair of adjacent outer heating elements of the plurality of heating elements, and
wherein the first pair of adjacent inner heating elements is separated from the second pair of adjacent outer heating elements by a third distance that is smaller than the first distance and greater than the second distance; and
a temperature sensor in thermal communication with the DG-BSS FET.

12. The integrated circuit of claim 11, wherein radii of the first pair of adjacent inner heating elements are smaller than radii of the second pair of adjacent outer heating elements.

13. The integrated circuit of claim 11, wherein the plurality of heating elements are spaced apart from each other such that the plurality of heating elements have temperature differentials with respect to a thermal ground equal to each other.

14. The integrated circuit of claim 11, wherein a sum of resistances of an innermost heating element and an outermost heating element of the plurality of heating elements is equal to a sum of resistances of a third pair of adjacent heating elements of the plurality of heating elements and wherein the third pair of heating elements is disposed between the innermost and outermost heating elements.

15. The integrated circuit of claim 11, wherein a sum of radii of a third pair of heating elements of the plurality of heating elements is equal to a sum of radii of a fourth pair of heating elements of the plurality of heating elements.

16. The integrated circuit of claim 11, wherein the heater is configured to maintain a temperature gradient across its surface area less than or equal to 1.5° C.

17. An integrated circuit, comprising:
a semiconductor device comprising:
a source region and a drain region in an active region and laterally separated from each other by a channel region,
a first gate dielectric disposed on a first surface of the channel region, and
a second gate dielectric disposed on a second surface of the channel region opposite to the first surface;
a dielectric layer disposed on the semiconductor device; and
a heater having circular shaped heating elements arranged in concentric rings and disposed within the dielectric layer, wherein a first distance between a first pair of adjacent inner circular shaped heating elements is greater than a second distance between a second pair of adjacent outer circular shaped heating elements and wherein the first pair of adjacent inner heating elements is separated from the second pair of adjacent outer heating elements by a third distance that is smaller than the first distance and greater than the second distance.

18. The integrated circuit of claim 17, wherein a sum of radii of a third pair of the circular shaped heating elements is equal to a sum of radii of a fourth pair of the circular shaped heating elements; and
wherein the radii of the third and fourth pair of the heating elements are different from each other.

19. The integrated circuit of claim 17, wherein the circular shaped heating elements are electrically connected in pairs such that each pair of the electrically connected circular shaped heating elements has a resistance equal to each other.

20. The integrated circuit of claim 17, further comprising:
a fluidic channel disposed on the second gate dielectric and configured to be heated by the circular shaped heating elements;
a temperature sensor configured to detect temperature of a fluid in the fluidic channel; and
a control loop configured to adjust a parameter of the heater based on the temperature detected by the temperature sensor.

* * * * *